(12) United States Patent
Kim (10) Patent No.: US 7,542,332 B1
(45) Date of Patent: *Jun. 2, 2009

(54) STACKED SRAM INCLUDING SEGMENT READ CIRCUIT

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 0 days.

This patent is subject to a terminal disclaimer.

(21) Appl. No.: 11/872,717

(22) Filed: Oct. 16, 2007

Related U.S. Application Data (63) Continuation of application No. 11/872,715, filed on Oct. 16, 2007.

(51) Int. Cl.
*G11C 11/00* (2006.01)

(52) U.S. Cl. ............... 365/154; 365/49.17; 365/189.15; 365/189.17; 365/194; 365/207; 365/230.03

(58) Field of Classification Search ............... 365/49.17, 365/154, 189.15, 189.17, 194, 207, 230.03
See application file for complete search history.

(56) References Cited

U.S. PATENT DOCUMENTS 5,896,336 A * 4/1999 McClure .................... 365/205
6,417,032 B1 * 7/2002 Liaw .......................... 438/153
6,829,195 B2 * 12/2004 Uchida et al. ........... 365/230.03
7,151,696 B2 * 12/2006 Suh et al. ................ 365/185.25
7,158,428 B2     1/2007 Fujimoto

* cited by examiner

*Primary Examiner*—Hoai V Ho (57) ABSTRACT

Bit lines in SRAM array are multi-divided, so that a segment read circuit is connected to local bit line, which circuit serves as amplifying transistor of an amplifier with load device of a block read circuit. Thus the amplified voltage is latched by a current mirror which serves as another amplifier in the block read circuit, such that one data is latched early but another data is latched later because the amplifier changes its output quickly or slowly depending on the local bit line voltage. In this manner, time-domain sensing scheme is introduced to differentiate fast data and slow data, where the locking signal is generated by a read enable signal or a reference signal based on fast data. Additionally, alternatives and applications are described. And memory cell is formed from polysilicon because the memory cell drives lightly loaded bit line even though polysilicon transistor can flow low current, which realizes stacked memory.

19 Claims, 7 Drawing Sheets

Truth table: (positive logic)

| nsdata | sdata | cdata | ncdata | Match line | Result |
|--------|-------|-------|--------|------------|--------|
| 0 | 0 | x | x | High | Match |
| 1 | 0 | 1 | 0 | Low | Mis-match |
| 1 | 0 | 0 | 1 | High | Match |
| 0 | 1 | 1 | 0 | High | Match |
| 0 | 1 | 0 | 1 | Low | Mis-match |

STACKED SRAM INCLUDING SEGMENT READ CIRCUIT

CROSS REFERENCE TO RELATED APPLICATION

The present invention is a continuation of application Ser. No. 11/872,715, filed on Oct. 16, 2007, which is herein incorporated by reference.

FIELD OF THE INVENTION

The present invention relates generally to integrated circuits, in particular to high-speed and high-density SRAM (Static Random Access Memory).

BACKGROUND OF THE INVENTION

For its high-speed and short cycle time, the SRAM (Static Random Access Memory) is utilized extensively as a cache memory in computer systems. Furthermore, the SRAM is simple to use with no refresh cycle, while DRAM (Dynamic Random Access Memory) requires refresh cycle. As such, the SRAM constitutes a key component that holds sway on the speed and performance of the computer system. Efforts of research and development have been under way primarily to boost the operating speed of the memory.

Figure 1:
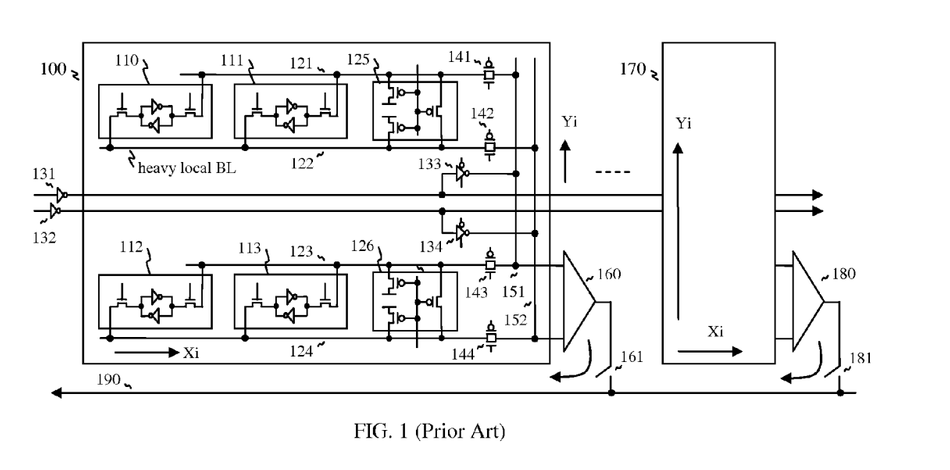
FIG. 1 illustrates the static random access memory, as a prior art.

FIG. 1 illustrates a circuit diagram of a conventional SRAM including memory cell array, a write circuit and a sense amplifier, as published, U.S. Pat. No. 7,158,428, No. 6,075,729 and No. 4,712,194. The memory block 100 includes memory cells 110, 111, 112 and 113 having six transistors. The memory cells are connected to local bit lines 121, 122, 123 and 124, which bit lines are pre-charged by pre-charge circuits 125 and 126, respectively. During standby, the pre-charge circuits 125 and 126 preset the bit lines to high. After then, the bit lines are released from the pre-charge state when read and write. Thus the stored voltage of the memory is transferred to the sense amp 160 through the transfer gate. When the memory cell 110 is selected, the transfer gates 141 and 142 are turned on, while the other transfer gates 143 and 144 keep turn-off state. In doing so, the memory cell data is read by the sense amp 160 through the common bit lines 151 and 152. The read output of the sense amp 160 is transferred to output node 190 through a transfer gate 161, while unselected memory block 170 and unselected sense amp 180 are in pre-charge state and transfer gate 181 keeps turn-off state. When write, write buffers 131 and 132 transfer input data to tri-state buffers 133 and 134, respectively, so that the input data is transferred to the bit lines and the bit line voltages are transferred to the memory cell nodes when word lines of the memory cell are asserted to high.

In the conventional SRAM, six-transistor memory cell 110 is used to store data, such that a latch including two cross coupled inverters stores voltage data. In order to achieve fast access, the inverters should be strong enough to drive heavily loaded bit line, but the inverters should be weak enough to be flipped by the write buffers 133 and 134 through the transfer gates 141 and 142. Furthermore, floating bit lines may flip the unselected memory cells during write operation. For example, the unselected memory cell 112 receives same word line voltage in the selected memory cell 110, so that the memory cell 112 will lose its data when the latch is too weak and the bit line loading is too heavy because both bit lines 123 and 124 are pre-charged to high voltage, while the selected bit line 121 and 122 receive input data from write drivers 133 and 134. And the transfer transistor of the memory cell should be strong enough to transfer the stored data to bit lines and receive the input data. As a result, the transistors in the memory cell are bigger than minimum feature size within the fabrication process limit typically, which increases the chip area. And access time is also slow because the whole chip area is big, which increases propagation delay with heavy loaded routing line.

There are many efforts to improve the conventional SRAM, with new circuit concepts, such that memory array is multi-divided in order to reduce parasitic loading of local bit line by introducing hierarchical bit line architecture, as published U.S. Pat. No. 7,158,428. However, each memory segment including the local bit line comprises more circuits such as a cross-coupled keeper transistor circuit, a local read amplifier circuit, pre-charge transistors, and transfer transistors, which increases chip area. And another prior art is shown, "A low power SRAM Using Hierarchical Bit Line and Local Sense Amplifiers", Yang et al, IEEE Journal of Solis-State Circuits, Vol. 40, No. 6, June 2005, such that the local sense amplifier improves write operation, but is can not improve read operation because the local sense amplifier is not activated for read cycle, in order to avoid wrong flip with the charges from heavily loaded global bit line. As a result, the access time is still slow and area is increased more.

In this respect, there is still a need for improving the static random access memory, in order to achieve fast access and reduce cell area. Furthermore, there is one more need for preventing flip of unselected cell by heavily loaded bit line during write operation. In the present invention, multi-divided bit line architecture is introduced to reduce the parasitic capacitance of the bit line, so that a segment read circuit is added for reading the local bit line more effectively, which realizes fast reading. The lightly loaded bit line does not disturb the unselected cells in the same row during write operation. Alternatively, a time-domain sensing scheme is introduced in order to differentiate low voltage data and high voltage data in the time-domain, which does not require the conventional sense amp and achieves fast access.

In particular, the memory cell can be formed from thin film polysilicon layer, because the lightly loaded bit line can be quickly discharged by the cell transistor even tough the thin film cell transistor can flow relatively low current. In doing so, multi-stacked SRAM is realized with thin film cell transistor, which can increase the density within the conventional CMOS process with additional process steps, because the conventional CMOS process is reached to the scaling limit for fabricating cell transistors on the surface of the wafer. More detailed explanation will be followed as below.

SUMMARY OF THE INVENTION

In the present invention, stacked-type static random access memory including segment read circuit is described. In order to achieve fast read operation, multi-divided bit line architecture is introduced, which reduces the parasitic capacitance of local bit line. By reducing bit line loading, the bit line is quickly changed when reading or writing data. Furthermore, the current flow of the cell transistor can be reduced because the cell transistor only drives a lightly loaded local bit line, which means that the cell transistor can be miniaturized further. Moreover, the present invention can overcome scaling limit of the conventional CMOS process with multi-stacked memory cell structure because stacked memory cell only drives lightly loaded bit line even though thin film polysilicon transistor can flow lower current. There are no limits to stack multiple memory cells as long as the flatness is enough to accumulate the cell transistors.

Furthermore, segment read circuit is added for amplifying bit line voltage, where multiple segment read circuits are connected to a block read circuit, in order to reduce area. In doing so, an amplifier is composed of amplifying device in the segment read circuit and load device in the block read circuit. And the segment read circuit includes only a few transistors to insert in the memory array repeatedly. Hence, the block read circuit determines read output based on amplified voltage from the amplifier, and transfers the read data to a latch circuit through a read path. After then, the read data is latched in the latch circuit before a latch control circuit locks the latch circuits with a read enable signal. Alternatively, time-domain sensing scheme is introduced to differentiate low voltage data and high voltage data, such that a reference signal is generated by one of fast changing data with reference cells, which signal serves as a locking signal for the latch circuit in order to reject latching one of slow changing data. For example, high voltage data is arrived first while low voltage data is arrived later, or low voltage data is arrived first while high voltage data is arrived later depending on array configuration.

The time-domain sensing scheme effectively differentiate low voltage data and high voltage data with time delay control, while the conventional sensing scheme is current-domain or voltage-domain sensing scheme. In the convention memory, the selected memory cell discharges the bit line, and the discharged voltage of the bit line is compared by a comparator. Now in the present invention, there is one more converting step to read the data, such that the selected memory cell discharges the local bit line, the segment read circuit amplifies the voltage of the bit line, and the voltage data is converted to time difference by the block read circuit. Furthermore, the block read circuit is tunable to differentiate fast data and slow data, more effectively. As a result, the read output of the block read circuit is reached to the latch circuit through the returning data path. In doing so, fast data is reached to the latch circuit earlier, while slow data is rejected by the locking signal which is based on fast data. There are many advantages to adopt the time-domain sensing scheme, so that the sensing time is easily controlled by the tunable delay circuit, which compensates wafer-to-wafer variation as well. And current consumption is lower because there is no static current path during read, while conventional differential amplifier sets up a current path for reading.

And a delay circuit is added for generating the locking signal from the reference signal because there is a need for adding a predetermined delay time before locking the latch circuit with the statistical data for all the memory cells such as mean time between fast data and slow data, in order to compensate cell-to-cell variations. Thereby the delay circuit generates a delay for optimum range of locking time. And the read output from the memory cell is transferred to the latch circuit through a returning read path, thus the access time is equal regardless of the location of the selected memory cell, which is advantageous to transfer the read output to the external pad at a time.

Furthermore, various alternative configurations are described and an example application for content addressable memory is described. Furthermore, example memory cell layout and cross sectional views are illustrated to minimize cell area. Still furthermore the fabrication method is compatible with the conventional CMOS process with additional steps.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 2:
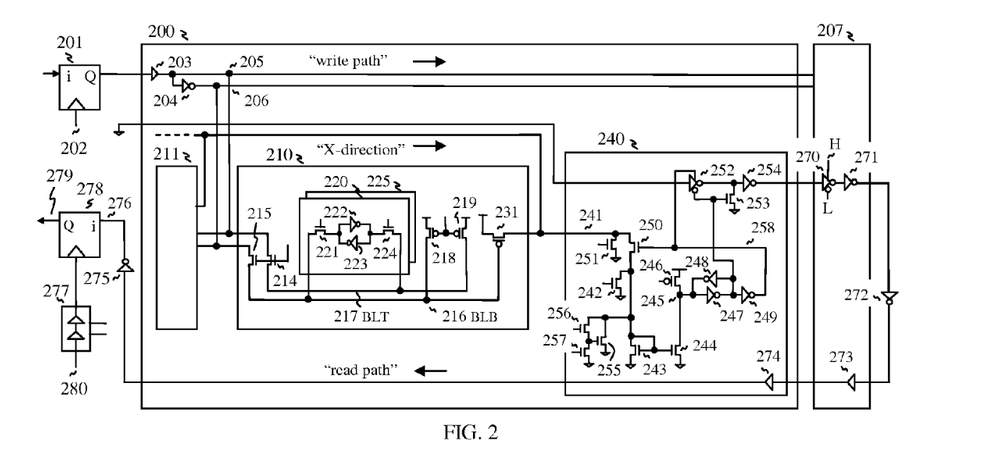
FIG. 2 illustrates high-speed SRAM including segment read circuit, according to the teachings of the present invention.

The present invention is directed to high-speed SRAM including segment read circuit, as shown in FIG. 2, wherein a memory block 200 is composed of multiple memory segments 210 and 211, a block read circuit 240, and write buffers 203 and 204. The write buffer 203 receives output of a data input latch 201 which is control by input control signal 202, and block write lines 205 and 206 are connected to the write buffer 203 and an inverter 204 respectively, in order to write data. The memory segment 210 comprises a segment write circuit including write select transistors 214 and 215 to write data to memory cells 220 and 225 through negative local bit line 216 and positive local bit line 217, a pre-charge circuit including segment pre-charge transistors 218 and 219 to set the local bit lines 216 and 217 respectively, and a segment read circuit including a segment read transistor 231 to read the stored data. And multiple segment read circuits are connected to a block read line 241 in x-direction, to transfer the amplified voltage output to a block read circuit 240, such that only one segment read circuit is activated during read operation. In particular, the local bit lines 216 and 217 are lightly loaded with multi-divided bit line architecture, which means that the memory cell can be miniaturized further.

In order to read data, the segment pre-charge transistors 218 and 219 are turned off to release the local bit lines 216 and 217 from a pre-charge state while the write transfer transistors 214 and 215 keep turn-off state. Then, one of memory cells is selected. For example, the memory cell 220 is selected by turning on pass transistor 221 with a word line, while another transfer transistor 224 keeps turn-off state to reduce discharging current through positive bit line (BLT) 217. When the stored data is "1", negative bit line (BLB) 216 is discharged to VSS (ground) voltage. Thus, the PMOS segment read transistor 231 is turned on by the selected memory cell 220 through the local bit line 216. By turning on the segment read circuit 231, the block read line 241 is charged to high from low, while the feedback transistor 250 is turned on, because an amplifier is composed of the segment read circuit as a amplifying transistor and pull-down transistors 243 and 255 as load device or active load. And the block read circuit 240 is already released from the pre-charge state by pre-charge transistors 242 and 251 before the word line of the pass transistor 221 is asserted. By charging the block read line 241 to high, a latch node 245 is changed to low from pre-charge state by a current mirror (current repeater) 244 while the current mirror 244 flows the amount of current of a pull-down transistor 243. After then, the feedback transistor 250 is turned off by the latched data 258 of inverter 249, and the latched data 258 is stored in the latch including two inverters 247 and 248. Simultaneously, the latched data 258 is transferred to data output latch 278 through a read path including a read inverter 254, inverting buffers 270, 271, 272 and 275, non-inverting buffers 273 and 274, because an output transfer transistor 253 is turned on, and also the selected tri-state inverter 252 is turned off by the latch output 258 while unselected tri-state inverter 270 in the unselected memory block 207 is turned on in order to bypass the read data from the selected memory block 200.

The segment read circuit 231 is much stronger than that of memory cell with wide channel transistors to drive the block read line which is heavily loaded with multiple memory segments. Furthermore, the segment read circuit need not reference bit line because the read circuits do not compare voltage or current but the read circuits detects whether the segment read circuit is turned on or not by the selected memory cell through the local bit line. Moreover, only a few transistors are added for each segment, such that the segment read circuit, the segment pre-charge transistor and segment write transistors can be placed next to the memory cells with small area repeatedly. Additionally, the read transistor of the segment read circuit can be composed of a low threshold MOS transistor, which achieves fast read operation. And the block read circuit 240 determines whether the data is "1" or "0" finally with current mirror circuit, wherein another amplifier is composed of the current mirror 244 and a pull-up transistor of the feedback inverter 248 as an active load, where the pull-up transistor of the feedback inverter is much weaker than the current mirror. In addition, the current mirror can be composed of a low threshold MOS transistor, which achieves fast read operation as well. In this manner, the configuration of the memory block is simpler than the conventional sense amplifier including differential amplifier.

In particular, the read path includes a returning path, so that the arriving time to the data latch circuit 278 is almost same regardless of location of the selected memory cell for reading data "1", as long as the memory cell receives the address inputs from the latch circuit side and delay time of the address inputs include similar to the read path including multiple buffers (not shown). Furthermore, the returning path is inverted by inverter 272 which compensates the strength of the rise time and the fall time of the buffers. Without inverting, the long read path includes only rising delay, because the rise time and the fall time are not equal in CMOS buffer. In doing so, the data output 279 is stored in the data output latch 278 while a latch control circuit 277 generates an enable signal with read enable signal 280, where the latch control circuit 277 is a tunable delay circuit to lock the latch 278 after the data "1" is arrived, in order to reject latching data "0". In contrast, the block read line 241 is not changed from the pre-charge state when the stored data is "0", because the memory cell does not pull-down the local bit line 216 where the negative storage node of the memory cell stores high voltage so that the selected local bit line is not changed, which does not turn on the PMOS segment read transistor 231. And the block read circuit 240 is not changed either. Thereby power consumption is reduced during read "0".

However, the floating local bit line 216 is slowly discharged by leakage current, and reached to VDD−VT voltage where VT is threshold voltage of the NMOS pass transistor 221, because the NMOS pass transistor 221 has no inversion channel when the local bit line is higher than VDD−VT voltage. When the local bit line 216 is reached to VDD−VT voltage, the NMOS pass gate 221 is weakly turned on, so that the local bit line 216 stays near VDD−VT voltage only if other memory cells in the same bit line 215 store low voltage data in the negative storage node. At the same time, the PMOS segment read transistor 231 is weakly turned on, which may flip the latch through the current mirror if the current mirror 244 is much stronger than feedback inverter 248. In order to avoid false latching with the weak turn-on, the strength of the amplifier is tunable with additional pull-down transistor 255 which is controlled by NMOS transistor 256 and 257, such that NMOS transistor 255 serves as an additional active load when enable transistor 256 is turn on while disable transistor 257 is turned off. Alternatively, resistors can be used as load device for the amplifier even though the area may be wider than active load device. And the tuning information for the amplifier is stored a nonvolatile memory. On the contrary, additional NMOS transistor 255 does not serve as an active load when enable transistor 256 is turn off while disable transistor 257 is turned on. And more active loads can be added even though the drawing illustrates only one tunable active load. Furthermore, the read access time is faster than that of the conventional memory, such that multi-divided bit line architecture is introduced in order to reduce the parasitic capacitance of local bit line. And, weak cell transistor can drive the lightly loaded bit line, which realizes to miniaturize the memory cell further.

And write operation is executed by the write buffers 203 and 204 through two transfer transistors 214 and 215, while pre-charge transistors 218 and 219 are released. Thereby, the write operation is performed by the transfer transistors 214 and 215, and the write buffers 203 and 204. During write operation, multiple memory cells are turned on by one word line but one memory cell is selected by column decoder (not shown). For example, one input data is provided to eight columns so that only one column is modified but the other seven columns should keep the stored data. However, the stored data in the unselected memory cells can be lost when the local bit line loading too heavy or the latch in the memory cell is too weak. By adopting multi-divided bit line architecture, the bit line loading is relatively light, which reduces the disturbance to the latch in the memory cell. This means that the unselected cells are less disturbed while the selected memory cell is written.

Another aspect for the read operation is that the word line voltage affects the read access time, such that the word line for the selected memory cell is raised to higher than VDD+VT level in order to avoid NMOS threshold voltage drop. Hence the local bit line 217 is reached to full VDD level, which realizes fast access time with strong pull-up of the segment read transistor 231. Furthermore, the local bit line is sustained to full VDD voltage when reading data "0", which fully turns off the segment read transistor, and prevents wrong flip with data "0". This alternative implementation is more useful for controller design where there are multiple power supplies in a chip, such as microprocessor.

Figure 3A:
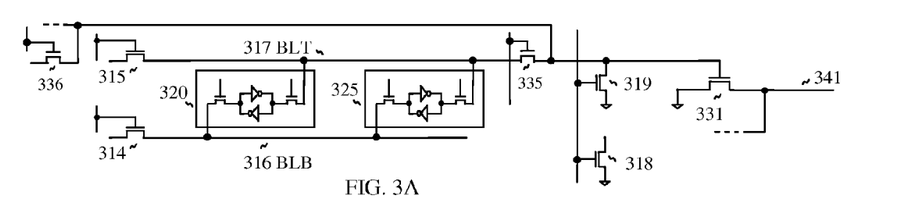
FIG. 3A illustrates alternative segment read circuit with PMOS transistors.

Moreover, there are various modifications and alternatives for configuring the segment read circuit to read data from the memory cell through the multi-divided bit line. One alternative configuration including NMOS transistors is illustrated in FIG. 3A, wherein write transfer transistors 314 and 315 are connected to negative bit line 316 and positive bit line 317, respectively. And memory cells 320 and 325 are connected to the bit line pair 316 and 317, and NMOS pre-charge transistors 318 and 319 are connected to the bit lines through NMOS read transfer transistors 335 and 336. NMOS segment read circuit 331 is connected to read transfer transistor 335, which read circuit 331 configures output portion 341. And positive control signals are applied for controlling NMOS pre-charge transistors and NMOS select transistor 331. Thus, the segment read transistor 331 is shared by multiple local bit lines, which is useful to reduce number of segment read circuit, so that the parasitic capacitance of the block read line can be reduced.

Figure 3B:
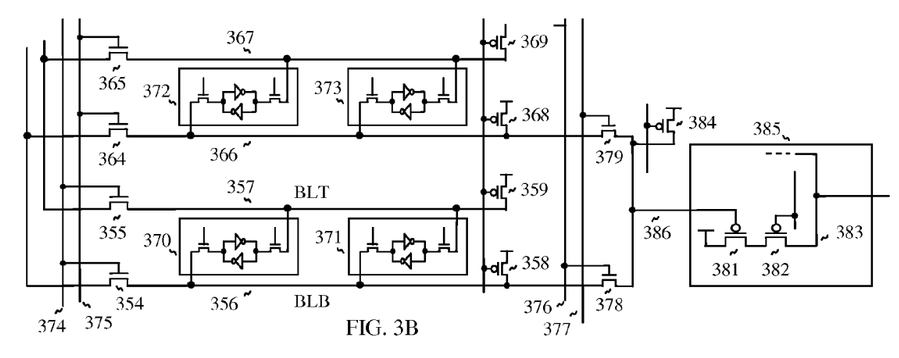
FIG. 3B illustrates an alternative configuration including multiplexer, according to the teachings of the present invention.

In FIG. 3B, an alternative configuration including multiplexer is illustrated, wherein a segment read circuit 385 is connected to multiple bit lines including 356 and 366 through transfer transistors 378 and 379, pre-charge transistor 384 is connected to common node 386 for the segment read transistor 381. To read data, two of memory cells are activated by one of word line, but the multiplexer including transfer transistors 378 and 379 selects one of two memory cells with column decoder outputs 376 and 377. Pre-charge transistor 384 for common node is turned off, and pre-charge transistors 358, 359, 368 and 369 for local bit lines are turned off as well during read. Write transfer transistors 354, 355, 364 and 365 are also turned off. After the common node 386 is settled down, the segment select transistor 382 is turned on. To write data, one pair of write transistor is turned on to bypass input data through a pair of write transfer transistors 354 and 355 (or the other pair 364 and 365). For example, write transistors 354 and 355 are turned on by asserting write control signal 374 to high, while another write control signal 375 keeps low. Thus, write input data is transferred to local bit lines 356 and 357. During write data to the memory cell 370, adjacent memory cell 371 is unselected because the word line is not asserted, and the unselected memory cell 373 is unselected as well. However, another adjacent memory cell 372 is activated. In order to keep the stored data in the activated memory cell 372, bit line capacitance is reduced by adopting multi-divided bit line architecture, so that the lightly loaded local bit lines do not flip the activated memory cell 372 (but unselected cell) as long as the memory cell can absorb a little charges from the local bit line, which realizes safe write operation even though the memory cell is small and weak.

Figure 4:
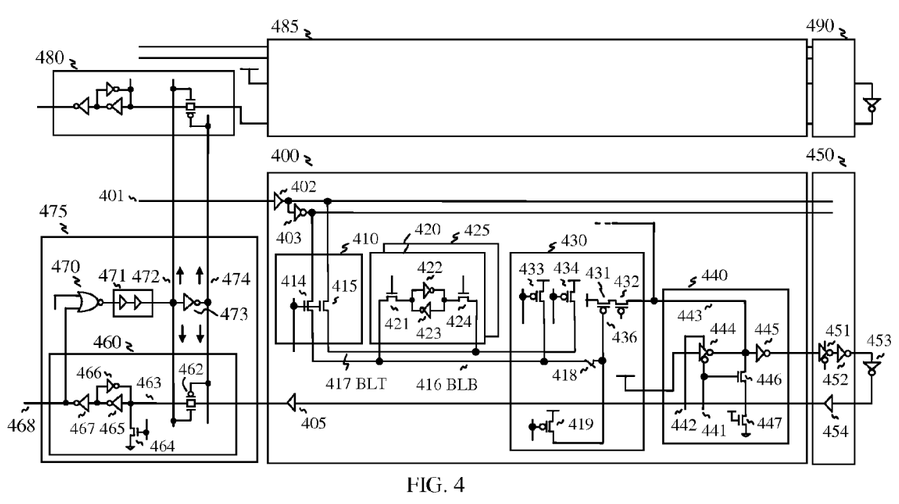
FIG. 4 illustrates a time-domain sensing scheme as an alternative configuration, according to the teachings of the present invention.

In FIG. 4, a time-domain sensing scheme including the segment read circuit as an alternative configuration is illustrated, wherein a memory block 400 is composed of multiple memory cells 420 and 425, segment read circuits 430, write buffer 402 and 403, write circuit 410 including transistors 414 and 415, and a read buffer 405. The write buffer 402 receives data input 401, and the read buffer 405 receives read output from memory cell through read path including inverting buffers 445, 451 and 452, and non-inverting buffers 405, 453 and 454. Segment pre-charge transistor 419 is connected to the segment read line 436, and a segment selector transistor 432 is connected to the segment read transistor 431 to activate the segment read circuit 430. And the block read circuit 440 is connected to the segment read circuit 430 through a block read line 443. To read data, the pre-charge transistors 433 and 434 are turned off and one of memory cells is turned on. After then a word line of the selected memory cell is asserted. Thereby the segment read line 436 is discharged by the selected cell through transfer transistor 418, when VDD voltage is stored in the negative storage node of the memory cell (while VSS voltage is stored in the positive storage node). This means that the negative bit line (BLB) 416 discharges the segment read line 436 through the transfer transistor 421 while the positive bit line (BLT) 417 keeps pre-charge state when transfer transistor 424 is turned off. Otherwise the segment read line 436 is not discharged when VSS voltage is stored in the selected memory cell (while VDD voltage is stored in the negative storage node). When the memory block 400 is selected, tri-state inverter 444 in the block read circuit 440 is turned off by the block selector signal 441 (high) and 442 (low), while the tri-state inverter 451 in the unselected block 450 is turned on in order to bypass the read output. Simultaneously, the pull-down transistors 446 and 447 as active load device are turned on for the selected block, so that an amplifier is composed with the pull-up transistors in the segment read circuit 430, thus the pull-down strength is much weaker than the pull-up strength of the segment read circuit 430. For example, the pull-down strength is one-tenth of the pull-up strength. As a result, the block read line 443 is pulled up near supply voltage when read data "1", thus output of read buffer 445 is changed to low by the block read line 443, and which output is transferred to next block 450, but the output of the read buffer 445 keeps high when reading data "0" from low voltage data in the memory cell because the segment read line 436 keeps pre-charge state, which does not turn on the PMOS read transistor 431. Thus the block read line 443 remains at low with the weak pull-down devices 446 and 447. Alternatively, reverse connection equally works, such that positive bit line is connected to the segment read circuit and the write buffers are connected reversely as well. And the read path is reversed to recover the positive phase for the data.

And the read output from the memory cell is transferred to a latch circuit 460 through a read path including the read buffer 445, tri-state inverter 451, inverters 452 and 453, and buffers 454 and 405. In particular, the read path includes a returning path, so that the arriving time to the latch circuit is almost same regardless of location of the selected cell, as long as the word line receives the address inputs from the latch circuit side and delay time of the address inputs include similar to the read path including multiple buffers (not shown). Furthermore, the returning path is inverted by inverter 453 which compensates the strength of the rise time and the fall time of the buffers. Without inverting, the long read path includes only rising delay, because the rise time and the fall time are not equal in CMOS buffer.

In the latch circuit 460, the read output changes the latch node 463 and output 468 to high from low through inverters 465 and 467 because the latch node 463 is pre-charged to low by NMOS 464 before activated. After then, the read output is stored in the latch node 463 with cross coupled inverters 465 and 466. And the output 468 changes NOR gate 470 to low, so that the transmission gate 462 is locked by signal 472 and 474 which are transferred from the output 468 through a tunable delay circuit 471 and inverter 473. Simultaneously, latch circuit 480 is also locked by the signal 472 and 474, where latch circuit 480 is composed of same circuits as the latch circuit 460. In doing so, the output 468 serves as a reference signal, which is generated by the reference memory cells, such as the memory cells 420 and 425 which store high voltage data in the positive storage node and low voltage data in the negative storage node. Adding delay circuit 471, the reference signal serves as a locking signal, where the delay circuit is tunable for differentiating high voltage data and low voltage data, more effectively, because high voltage data is arrived earlier while low voltage data is arrived later or not arrived. When low voltage data is stored in the selected memory cell, for example, the negative bit line (BLB) 416 is very slowly discharged to VDD−VT level by leakage current of multiple unselected cells which store low voltage data in the negative storage node, because the segment read line 436 is floating, so that the segment read transistor 431 is weakly turned on while the segment select transistor 432 is activated. By turning on the segment read circuit weakly, the block read line 443 is slightly pulled up but the pull-down transistors 446 and 447 rejects the pull-up if the pull-down strength is at least stronger than the weak pull-up based on weak inversion of the read transistor 431. Alternatively, the inverting read buffer 445 can be a Schmidt trigger to reject low voltage more effectively, which circuit can be composed of the conventional circuit techniques as published U.S. Pat. Nos. 4,539,489 and 6,084,456, thus detailed schematic is not described in the present invention, wherein an inverting type Schmidt trigger can be used for this application. Thus, one of two data is arrived earlier than the other data because of inversion state of the segment read transistor 431, so that one data is referred to as fast data and the other data is referred to as slow data.

Thus, the latch circuit 460 and the delay circuit 471 configure a latch control circuit 475, in order to generate the locking signal. More detailed delay circuit will be explained as below. And the NOR gate 470 is used to generate the reference signal even though one of reference cells is failed, where more than one reference column is added for configuring the memory block even though the drawing illustrates only one reference memory column 400 including the latch circuit 460. In this manner, fast data from the main memory block 485 and 490 are stored to the latch circuit 480 before the locking signals 472 and 474 locks the latches, while slow data are not latched. Furthermore, the read access time is faster than that of the conventional memory, such that multi-divided bit line architecture is introduced in order to reduce the parasitic capacitance of local bit line. As a result, the sensing scheme including the locking signal is referred to as a "time-domain sensing scheme" with the segment read circuit.

Figure 5A:
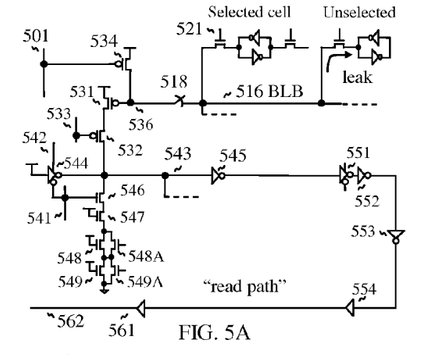
FIG. 5A illustrates a simplified circuit for read path of the time-domain sensing scheme.

In FIG. 5A, a simplified circuit for read path of the time-domain sensing scheme is illustrated. The pre-charge transistor 534 is controlled by pre-charge bar (PB) signal 501, and the pre-charge transistor 534 is connected to the segment read line (SRL) 536. The segment read line 536 is connected to the segment read transistor 531. Memory cells are connected to the local bit line (BLB) 516, the local bit line 516 is connected to the segment read line 536 through transfer switch 518, and the read select transistor 532 is connected to the segment read line (SRL) 536. The block read line 543 is amplified by the PMOS segment read transistor 531 when reading high voltage data. Hence, an inverting read buffer 545 receives the memory cell data through the block read line 543, and then the read output is transferred to output node (DO) 562 through a returning read path including inverting buffers 551, 552, 553 and 560, non-inverting buffer 554 and 561, only if the segment read circuit is turned on strongly. A tri-state inverter 544 is turned off for the selected block by block select signals 541 and 542, while another tri-state inverter 551 is turned on to bypass the read output for the unselected block, and the pull-down devices 546, 547, 548 and 549 are turned on but the pull-down strength is much weaker than pull-up strength of PMOS 531 and 532, where the select transistor 548A and 549A can adjust the pull-down strength with wide channel transistors. On the contrary, when reading low voltage data, the pull-down transistors 546, 547, 548 and 549 reject the pull-up only if the segment read circuit is weakly turned on, because the local bit line 516 is not discharged by the selected memory cell.

Figure 5B:
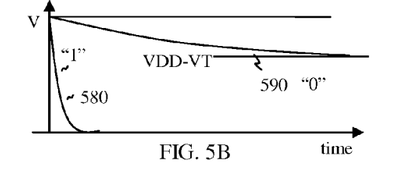
FIG. 5B illustrates discharge time of the segment read line and the local bit line.

In FIG. 5B, discharge time for the segment read line and the local bit line is illustrated. When the local bit line 516 is discharged by the selected memory cell only if the negative storage node of the selected memory cell stores low voltage data (and store high voltage in the positive storage node), the segment read line 536 is also discharged, as shown 580. On the contrary, the segment read line 536 is slowly discharged, as shown in 590, by leakage current when the negative bit line (BLB) 516 is not pulled down by the selected memory cell, because the segment read line 536 is floating until the segment read line 536 is discharged where the NMOS transfer transistor 521 of the memory cell is tuned off around VDD−VT level because of NMOS threshold voltage. Thus, the floating segment read line 536 is slowly discharged to VDD−VT level, so that the segment read transistor 531 can be weakly turned on. As a result, the segment read circuit may pull up the block read line 543 when the pull-down strength is too weak. In order to avoid false pull-up with weak inversion of the segment read circuit, the pull-down strength is optimized by the tunable pull-down transistors 548 and 549. Additionally, the locking signal based on fast data effectively rejects latching slow data in the data output latch (480 in FIG. 4) as explained above. Alternatively, the word line 521 can be raised to VDD+VT level or higher, in order to avoid NMOS threshold voltage drop for the transfer transistor of the memory cell, which configuration is useful for some controller design because there are multiple power supplies for a chip. Using multiple power supplies, there is no need of locking signal to reject slow data, which realizes simple circuit design with no reference memory cells and blocks.

Figure 5C:
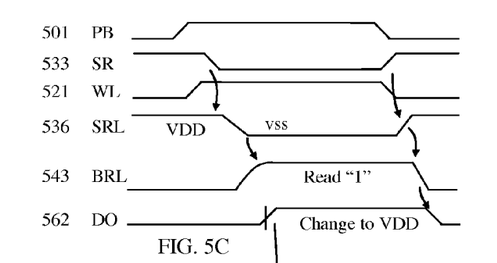
FIG. 5C illustrates read "1" timing diagram.

Referring now to FIG. 5C in view of FIG. 5A, detailed timing for reading data "1" is illustrated. To read data, the pre-charge bar (PB) signal 501 is raised to high, and the word line 521 is raised to predetermined voltage. After then, the segment read (SR) signal 533 is lowered to turn on the segment select transistor 532. Hence the segment read line 536 is discharged while negative bit line 516 is discharged by the memory cell, which discharges the segment read line 536 through transfer switch 518. Discharging the segment read line (SRL) 536, the block read line (BRL) 543 is pulled up near the supply voltage by the segment read circuit including pull-up transistors 531 and 532, because the pull-up transistors are much stronger that the pull-down transistors 546, 547, 548 and 549. And more memory cells may be connected to the local bit line 516, which increases parasitic capacitance and delays discharge time. Pulling up the block read line 543, the output of read buffer 545 is changed to low from high, and which output is transferred to output node (DO) 562 through the returning read path including inverting buffers 551, 552 and 553, and non-inverting buffers 554 and 561. During read operation, there is no phase control signal such that the cell data is immediately transferred to the output node 562 through the read path. More specifically, the segment read transistor 531 waits until the local bit line is discharged by the selected cell. Hence, read control is relatively simple, which also realizes fast access with lightly loaded bit line. Furthermore, threshold voltage of the segment read transistor 531 can be lower than that of other peripheral circuits, in order to achieve fast discharging the segment read line. After reading the data, all the control signals including the pre-charge bar (PB) signal 501, the word line 521, and other control signals, are returned to pre-charge state or standby mode, as shown FIG. 5C.

Figure 5D:
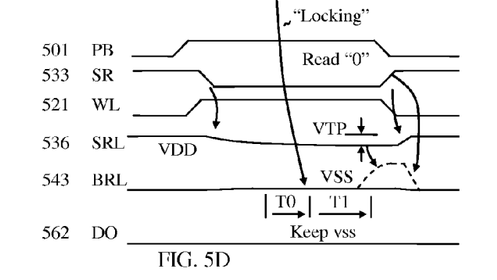
FIG. 5D illustrates read "0" timing diagram, according to the teachings of the present invention.

Referring now to FIG. 5D in view of FIG. 5A, detailed read timing for reading data "0" is illustrated, wherein the pull-up transistors 531 and 532 in the segment read circuit do not pull up the block read line 543 because the segment read line (SRL) 536 is not discharged by the memory cell when the negative bit line 516 keeps pre-charge state. Thereby, the block read line 543 keeps low with weak pull-down devices 546, 547, 548 and 549, thus the output (DO) 562 keeps low. However, the segment read line (SRL) 536 is slowly discharged by the turn-off current of the unselected cells while the segment read line 536 is floating, thus the segment read line 536 may be discharged to VDD−VT level by the unselected memory cells. The leakage current depends on how many cells are connected to the local bit line and how many cells store low voltage data in the negative storage node, because low voltage data has leakage current while high voltage data helps to keep the pre-charge voltage. When the segment read line 536 is reached to the threshold voltage of the PMOS transistor 531 by the leakage current, the PMOS transistor 531 starts to pull up the block read line 543 through the segment select transistor 532. Hence, the block read line 543 is gradually pulled up, which changes the read buffer 545. As a result the read output (DO) 562 is flipped to high. In order to avoid the false flip with the leakage current, the word line 521 can be raised to higher than VDD+VT level as explained above, or the pull-down strength can be adjusted by selecting the transistors 548A and 549A. And the reference signal is generated by fast data (high voltage data) with delay time as shown T0 in FIG. 5D, so that the timing margin T1 is defined to reject slow data (low voltage data). In this manner, the time-domain sensing scheme can differentiate high voltage data and low voltage data within the time domain even though leakage current is relatively high. This is obvious that the discharge current "i" through the segment read transistor 531 is defined as i=C*dv/dt, which is converted to dt=C*dv/i. Thereby, the discharge time "dt" is proportional to the discharge current inversely where the block read line (543) capacitance "C" and the discharge voltage "dv" are fixed to turn on the read buffer 545, which means that the discharged voltage of the selected bit line is transferred to the segment read line, the segment read line controls the segment read circuit which discharges the block read line, and discharge time is detected by the block read circuit including amplifier, so that the reference signal based on fast data is used to generate a locking signal to sense slow data in the time domain.

Figure 6:
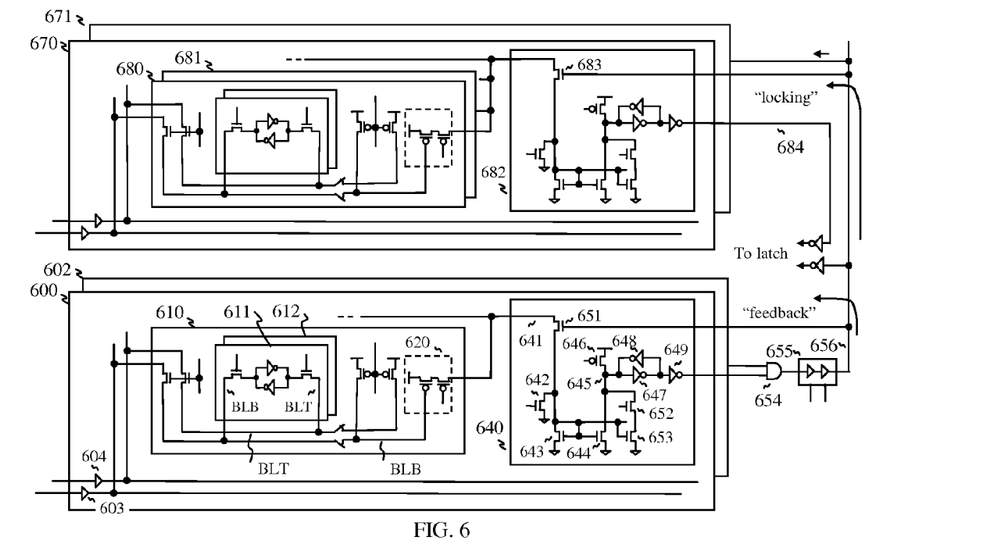
FIG. 6 illustrates the time-domain sensing scheme including a current mirror as a segment read circuit, according to the teachings of the present invention.

In FIG. 6, alternative configuration including a current mirror as a block read circuit in a memory block is illustrated. A memory block 600 includes memory segment 610 including segment read circuit 620 and memory cells 611 and 612, write buffers 603 and 604, and a block read circuit 640. The block read circuit 640 is composed of a current mirror circuit and a latch circuit, wherein the current mirror is composed of a pull-down transistor 643 and a current mirror (repeater) 644, and the latch circuit is composed of two cross coupled inverters 647 and 648. Additionally, the pull-down strength of the current repeater can be tunable with multiple repeaters including NMOS 653 which is selected by NMOS switch 652, and more current repeaters can be added even though the drawing illustrates only one selectable repeater. The pull-down transistor 643 is connected to the segment read circuit 620 through the block read line 641 and NMOS switch 651, and a pre-charge transistor 642. When fast data is read, the segment read circuit 620 pulls up the pull-down transistor 643 while the switch 651 is turned on and the pre-charge transistor 642 is turned off. Hence, the latch node 645 is changed to low from the pre-charged voltage, where the pre-charge transistor 646 is turned off during read. By lowering the latch node 645, the inverters 647 and 649 are changed, and the logic states are stored in the latch circuit including two cross coupled inverters 647 and 648. And inverter output signal 649 is transferred to AND gate 654. Furthermore, the AND gate 654 receives multiple signals from other memory block 602, so that the signal is generated only if at least one reference cell works correctly, which signal serves as a reference signal. Then a tunable delay circuit 655 adds a delay time for optimizing the reference signal. Thus, the tunable delay circuit output 656 serves as a locking signal to lock the latch circuits 682 in the main memory block 670 and other memory block 671, where the main memory blocks 670 and 671 include same configuration as the memory block 600, except the stored data in the reference memory block 600 is fast data to generate the reference signal. Thus the main memory blocks receive the locking signal 656. In doing so, the output 684 is determined by locking transfer transistor 683 with the locking signal 656. Advantage of using current mirror as a block read circuit is that the current path through the segment read circuit is short by a direct feedback of the output of the current mirror, which reduces current consumption with short feedback path during read operation. This configuration is more useful when the memory block is relatively small.

Figure 7:
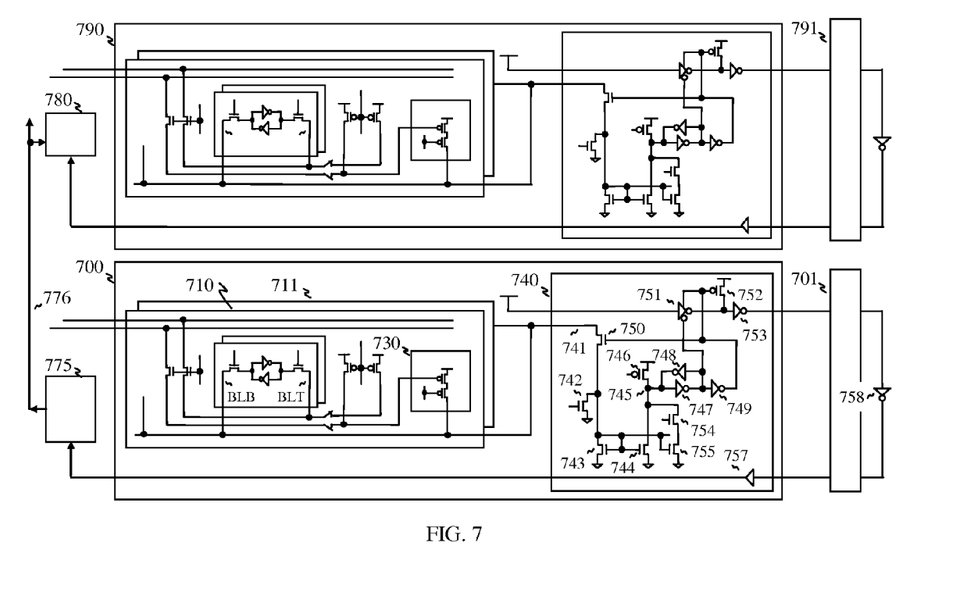
FIG. 7 illustrates the time-domain sensing scheme for configuring a big memory bank, according to the teachings of the present invention.

In FIG. 7, alternative configuration including a current mirror as a block read circuit in a memory bank including multiple memory blocks is illustrated. Memory blocks 700, 701, 790 and 791 configure a relatively big memory bank. The memory block 700 includes memory cell arrays 710 and 711, a segment read circuits 730, and a block read circuits 740. The block read circuit 740 is composed of a current mirror circuit and a latch circuit, wherein the current mirror is composed of a pull-down transistor 743 and a current repeater 744, and the latch circuit is composed of two cross coupled inverters 747 and 748. Additionally, the pull-down strength of the current repeater can be tunable with multiple repeaters including NMOS 755 which is selected by NMOS switch 754. The pull-down transistor 743 is connected to the segment read circuit 730 through the block read line 741 and NMOS switch 750, and a pre-charge transistor 742. When fast data is read, the segment read circuit 720 pulls up the pull-down transistor 743 while the switch 750 is turned on and the pre-charge transistor 742 is turned off. Hence, the latch node 745 is changed to low from the pre-charged voltage, where the pre-charge transistor 746 is turned off during read. By lowering the latch node 745, the inverters 747 and 749 are changed, and the logic state is stored in the cross coupled inverters 747 and 748. Then the latched (high) data in the inverter 747 disables a tri-state inverter 751 and the latched (low) data in the inverter 749 turns on PMOS 752. Turning on PMOS 752, output of inverter 753 is changed to low from high. And the output is transferred to the latch control circuit 775 through unselected block 759, inverting buffer 758 and non-inverting buffer 757, where the latch control circuit 775 is the same circuit as 475 in FIG. 4. As a result, a locking signal 776 is generated in order to lock latch circuit 780 for the main memory blocks 790 and 791. Advantage of using current mirror as a block read circuit is that the current path through the segment read circuit is directly cut off by its own feedback of the output of the current mirror, which reduces more current consumption during read operation with very short feedback path.

Figure 8:
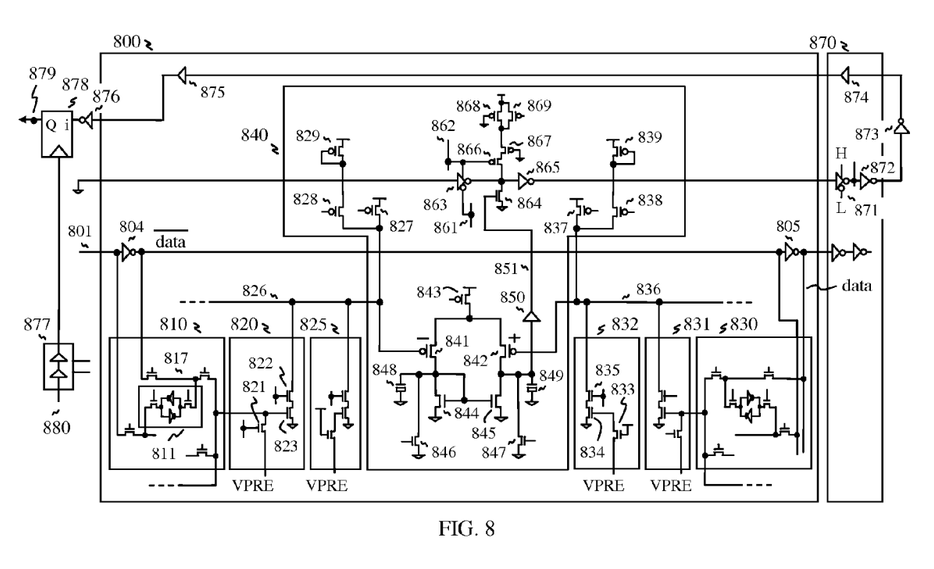
FIG. 8 illustrates alternative configuration with comparator as a block read circuit, according to the teachings of the present invention.

In FIG. 8, alternative configuration with a comparator as a block read circuit is illustrated, wherein the block read circuit 840 is composed of a comparator, active load device and transfer circuit. The segment read circuit 820 configures an amplifier with pull-up transistors 827, 828 and 829 as active load, for reading the selected memory cell array 810, where pull-up transistors 827 is very weak transistor with long channel. And the amplifier output 826 serves as the block read line, which amplifies the potential of a selected local bit line 817. And the local bit line 817 is driven by a selected memory cell 811. The selected segment read circuit 820 is composed of a read transistor 822, a select transistor 823 and a pre-charge transistor 821. On the contrary, another input 836 for the comparator is generated by a reference circuit 832, which is composed of same circuit as the segment read circuit 820, but a reference signal is asserted to the read transistor 834 through the pre-charge transistor 833 which is always turned on and receives pre-charge voltage VPRE (for example, half VDD voltage). And the select transistor 835 is turned on for generating a reference voltage 836, which configure an amplifier with pull-up transistors 837, 838 and 839. And unselected memory cell array 830 and unselected segment read circuit 831 keep pre-charge state. Furthermore, the amplifiers are tunable with selecting the pull-up strength of the transistors 828 and 838 in order to get the reference voltage near half VDD voltage, because the comparator including a differential amplifier has high gain near half VDD input. Thereby, the local bit line pulls down the amplifier output lower than half VDD when the local bit line voltage is near VDD voltage. Or the local bit line pulls up the amplifier output higher than half VDD when the local bit line voltage is near VSS voltage. And more tunable pull-up transistors can be added even though the drawing illustrates two pull-up transistors. In this manner, the differential amplifier differentiates data "1" and "0" with the mid level reference voltage, so that accurate sensing is achieved for small voltage of reduced memory cell, even though the amplifier and the differential amplifier consume current during read operation.

After the amplifier outputs are settled down, the pre-charge transistors 846 and 847 of differential amplifier are turned off, and then the differential amplifier including transistors 841 to 851 is activated by turning on pull-up PMOS 843. Hence, one of receiving transistors 841 and 842 quickly pulls up its drain node, while the other transistor pulls down, because of input voltage difference from the block read lines 826 and 836 which are generated by the amplifiers. And the differential amplifier has two inputs, so that one input is referred to as a negative input and another input is referred to as a positive input. In order to keep positive polarity, the memory cell array 810 stores negative data because the block read line 826 is connected to negative input transistor 841. Thereby, output from the differential amplifier is recovered to positive polarity. For example, when the stored data in the memory 811 is data "1", the selected local bit line 817 is lowered to ground because the positive storage node of the memory cell keeps low voltage, such that the amplifier output 826 is higher than half VDD voltage. To do so, the write buffer 804 receiving input data 801 inverts the write data to "low" voltage. By activating the differential amplifier, the drain node of the receiving transistor 841 and 842 start to changing, but the decoupling capacitors 848 and 849 react to change the drain nodes, so that the decoupling capacitors effectively suppress abrupt change when activated, which helps to reject coupling noise as well. The coupling capacitor size can be decided depending on the target speed because big capacitor delays the sensing speed while small capacitor does not help filtering noise. After then, the differential output is determined by a buffer 850, such that the buffer output 850 is raised to high because the reference amplifier output is near half VDD voltage and the amplifier out 826 is slightly higher than half VDD voltage when read data "1" from the negative side memory array 810. Thereby, the positive receiving transistor 842 pulls up its drain node, while the negative receiving transistor 841 pulls down its drain node. And NMOS active load 844 pulls down its drain node, so that another active load 845 has high impedance. As a result, the output of the differential amplifier generates near "high" output, and then the buffer 850 generates full high voltage based on the differential amplifier output. Alternatively, the buffer 850 can be a Schmidt trigger to determine output voltage more effectively. In contrast, when the memory array 830 in the right side is selected, the reference voltage generator circuit 825 in the left side is activated. And the memory array 830 stores positive data so that the non-inverter write buffer 805 is connected to the memory cell because the amplifier output 836 is connected to a positive receiving transistor 842. The read operation is the same as explained above.

After the differential amplifier generates read output 851, a pull-down transistor 864 receives the read output 851 from the differential amplifier, so that an output of an inverter 865 is changed to high, because the pull-down transistor 864 is fully turned on when the read data from the selected memory cell is high, where the strength of pull-up transistors including 866, 867, 868 and 869 is much weaker than that of the pull-down transistor 864. Thereby, the pull-down transistor 864 pulls down its drain only if the read data is "1". Otherwise, the pull-down transistor is turned off and the pull-up transistors sustain the input of inverter 865, and the tri-state inverter 863 is turned off for the selected block by block select signals 861 (high) and 862 (low). In contrast, the tri-state inverter 871 in the unselected block 870 is turned on to bypass the read output. Furthermore, the pull-up strength is tunable with selectable PMOS transistor 869 including wide channel, where more tunable pull-up transistors can be added even though the drawing illustrates only one tunable circuit. In doing so, weak turn on of the pull-down 864 is rejected by the pull-up transistors, such that the differential amplifier output is very slightly raised when the differential amplifier is activated typically, because both amplifier outputs moves toward half VDD voltage thus the drain nodes of the receiving transistors are slightly raised. The tunable pull-up transistors effectively reject the weak turn-on during transition time. And furthermore, the slight change is rejected by the buffer 850 including a Schmidt trigger as well. When read data "1", the read buffer 865 transfers the change to the output latch circuit 878, through read path including tri-state inverter 871, inverting buffers 872, 873 and 876, and non-inverting buffers 874 and 875. Then, the read output is stored in the latch circuit 878, and the latch control circuit 877 locks the latch circuit 878, where the latch control circuit 877 receives a read enable signal 880 and the read enable signal is delayed by a tunable delay circuit in the latch control circuit 877. And reverse configuration is also available with PMOS segment read circuit (not shown), such that the configuration for the differential amplifier is also reversed with NMOS receiving transistors.

Figure 9A:
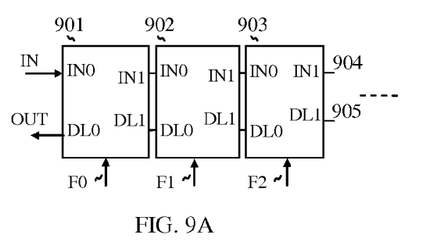
FIG. 9A illustrates a tunable delay circuit.
Figure 9B:
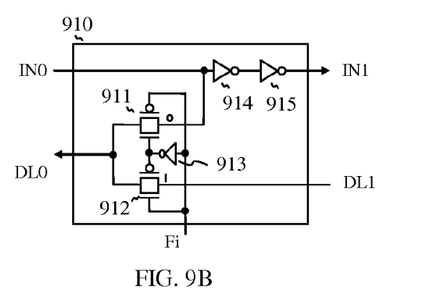
FIG. 9B illustrates a delay unit of the tunable delay circuit.

In FIG. 9A, more detailed a tunable delay circuit (as shown 277 in FIG. 2) is illustrated, wherein multiple delay units 901, 902 and 903 are connected in series, the first delay unit 901 receives input IN and generates output OUT, the second delay unit 902 is connected to the first delay unit, and the third delay unit 903 is connected to the second delay unit 902 and generates outputs 904 and 905, and so on. Each delay unit receives a fuse signal, such that the first delay unit receives F0, the second delay unit receives F1, and the third delay unit receives F2. And more detailed delay unit is illustrated in FIG. 9B, wherein the delay unit 910 receives an input IN0 and a fuse signal Fi, thus the fuse signal Fi selects output from the input IN0 or input DL1, so that a transfer gate 911 is turned on when the fuse signal Fi is low and output of inverter 913 is high, otherwise another transfer gate 912 is turned on when the fuse signal Fi is high and output of inverter 913 is low to bypass DL1 signal. Inverter chain 914 and 915 delays IN0 signal for the next delay unit, where more inverter chains or capacitors can be added for the delay even though the drawing illustrates only two inverters.

Figure 9C:
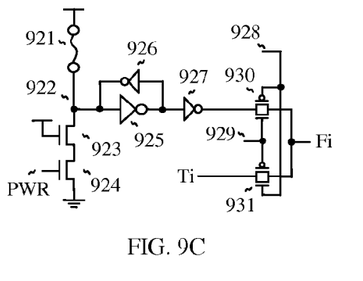
FIG. 9C illustrates a related fuse circuit of the tunable delay circuit, according to the teachings of the present invention.

In FIG. 9C, a related fuse circuit of the tunable delay circuit (as shown in FIG. 9A) is illustrated in order to store information for the delay time, so that a fuse serves as a nonvolatile memory, wherein a fuse 921 is connected to a latch node 922, a cross coupled latch including two inverters 925 and 926 are connected to the latch node 922, pull-down transistors 923 and 924 are connected serially to the latch node 922 for power-up reset. Transfer gate 930 is selected by a select signal 929 (high) and another select signal 928 (low) in order to bypass the latch node 922 through inverter 925 and 927. In doing so, fuse data is transferred to output node Fi, otherwise test input Ti is transferred to Fi when a transmission gate 931 is turned on.

Figure 10:
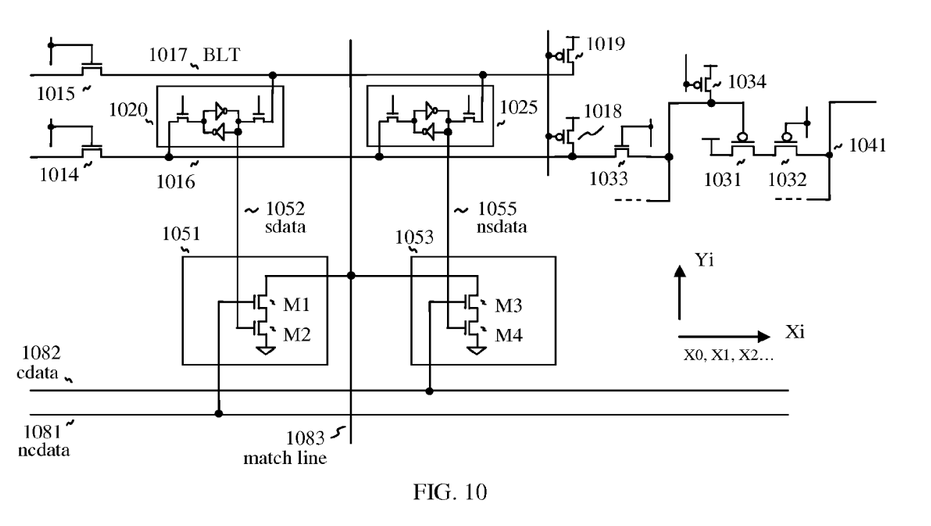
FIG. 10 illustrates an example application for content addressable memory, according to the teachings of the present invention.

Additionally, in FIG. 10, an example embodiment to implement CAM (content addressable memory) including the segment read circuit is illustrated. There are two memory cells (1020 and 1025) and two compare circuits (1051 and 1053) in a CAM cell. Read-write operation for the memory cells is the same as single port memory as explained above. And CAM operation is added in order to compare the stored data and the incoming data referred as comparand. In detail, a CAM is a storage device that is particularly suitable for matching functions because it can be instructed to compare a specific pattern of comparand data with data stored in an associative CAM array. A CAM can include a number of data storage locations, each of which can be accessed by a corresponding address. Functionality of a CAM depends at least in part on whether the CAM includes binary or ternary CAM cells. Ternary CAM cells are mask-per-bit CAM cells that effectively store three states of information, namely a logic "1" state, a logic "0" state, and a don't care state for compare operations.

Ternary CAM cells typically include a second memory cell that stores local mask data for the each ternary CAM cell. The local mask data masks the comparison result of the comparand data with the data stored in the first memory cell such that, when the mask bit has a first predetermined value (a logic "0", for example) its compare operation will be masked so that the comparison result does not affect the match line. The ternary CAM cell offers more flexibility to the user to determine on an entry-per-entry basis which bits in a word will be masked during a compare operation. However, the conventional SRAM cell based CAM is slow and big because transistors of the memory cell is wider than minimum feature size in order to drive heavy bit line during read, as published, U.S. Pat. No. 6,480,406. Thus the SRAM including segment read circuit is useful for the CAM application, which realizes high-speed and high-density CAM.

Detailed schematic is illustrated as shown in FIG. 10. The memory cells 1020 and 1025 store data in the storage nodes 1052 and 1055, respectively. Thus, the positive data are stored in the second storage nodes 1052 and 1055. The local bit lines 1016 and 1017 are connected to the memory cells to write data through write select transistors 1014 and 1015 respectively. And pre-charge transistors 1018 and 1019 are connected to the local bit lines 1016 and 1017 as well. To read data, the segment read circuit including MOS transistor 1031 and 1032 is connected to local bit line 1016, where the block read line 1041 is connected to the segment read circuit. Compare circuits 1051 and 1053 including NMOS transistors M1 and M2, M3 and M4 are connected to a match line 1083 (ML).

Figure 11:
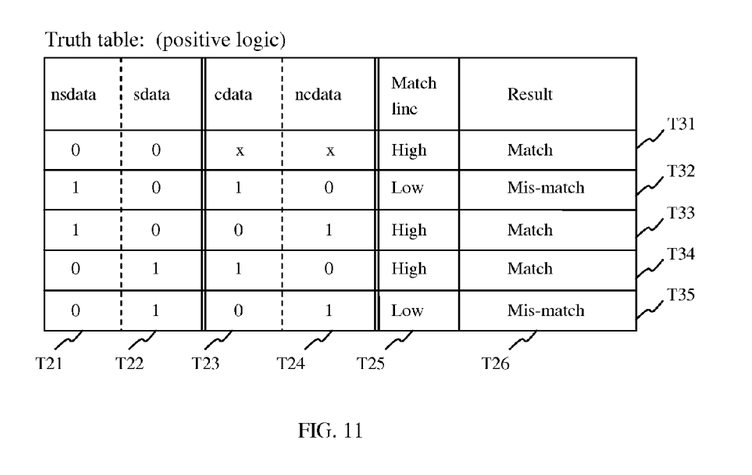
FIG. 11 illustrates a truth table summarizing the logical relationships among various signals for content addressable memory, according to the teachings of the present invention.

Referring now to FIG. 11 in view of FIG. 10, a truth table is shown summarizing the behavior of CAM cell in relation to signal states maintained by various elements within CAM cell in accordance with the present invention, wherein the compare circuits are configured by the NMOS M1 to M4. Thus, the signal polarities of the internal nodes are non-inverted for controlling the match line ML 1083. First column T21 lists binary states of "0" and "1" that can be stored in storage node 1055 (namely nsdata) of the memory cell (CAM) cell) 1025; second column T22 lists binary states of "0" and "1" that can be stored in storage node 1052 (namely sdata) of the memory cell CAM) cell) 1020. Third column T23 lists the ternary states that can be maintained in one of the complement compare data lines, namely cdata which is the signal 1082. Fourth column T24 lists the ternary states that can be maintained in the other complement compare data line, namely ncdata which is the signal 1081. Fifth column T25 lists "low" and "high" as the two available voltage levels for match line 1083. Finally, sixth column T26 lists "match" and "mismatch" as the two possible results for comparing states of ncdata line 1081 and cdata line 1082 with the states of CAM cell.

Continuing with FIG. 11 in view of FIG. 10, row T31 indicates masked case where sdata 1052 and nsdata 1055 are "0" which makes match line to stay the pre-charge level at logic high, regardless of the compare data, such that the stored data "0" has ground potential which turns off NMOS compare circuit M2 and M4, rows T32-T33 both indicate that "0" state of CAM cell is represented by "0" of memory cell 1020, and "1" of memory cell 1025. In row T32, because state "1" of cdata line 1082 does not match state "0" of CAM cell (sdata 1052), M3 and M4 set up a current path for the match line ML so that the match line ML is driven "low" to indicate a mismatch of the data key and the stored value of CAM cell. In row T33, because state "0" of cdata line 1082 matches state "0" of CAM cell (sdata 1052), match line ML is driven "high" to indicate a partial match of the comparand and the stored value of CAM.

Continuing still with FIG. 11 in view of FIG. 10, rows T34-T35 both indicate that "1" state of CAM cell is represented by "1" of memory cell 1020 and "0" of memory cell 1025. In row T34, because state "1" of cdata line 1082 matches state "1" of CAM cell, match line 1083 mL is driven "high" to indicate a partial match of the comparand and the stored value of CAM cell. In row T35, because state "0" of cdata line 1082 does not match state "1" of CAM cell, M1 and M2 set up a current path for the match line ML, so that the match line ML is driven "low" to indicate a mismatch of the comparand and the stored value of CAM cell.

Methods of Fabrication

The cell transistors can be formed from thin-film layer within the current CMOS process environment, in order to reduce chip area with stacking memory cells. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel, according to the prior arts. Now the LTPS can be used as a thin film transistor for the memory device. The thin film based cell transistor can drive multi-divided bit line which is lightly loaded, even though thin film polysilicon transistor can flow less current than single crystal silicon based transistor on the surface of the wafer. During LTPS process, the MOS transistor in the control circuit and routing metal are not degraded. And the steps in the process flow should be compatible with the current CMOS manufacturing environment as published as the prior arts, such as U.S. Pat. No. 6,174,764 and No. 5,734,179 for forming SRAM cell. In this respect, detailed manufacturing processes for forming the memory cell, such as width, length, thickness, temperature, forming method, or any other material related data, are not described in the present invention.

Figure 12A:
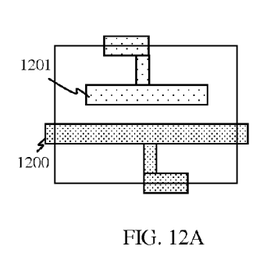
FIGS. 12A, 12B, 12C, 12D, 12E, and 12F illustrate an example memory cell layout for reducing cell area, according to the teachings of the present invention.

In FIGS. 12A to 12F, an example memory cell layout (as shown 220 in FIG. 2) including multiple layers is illustrated, wherein minimum or near minimum feature sizes can be used to reduce cell area because the memory cell drives only lightly loaded bit line. Furthermore, most of contacts are shared to reduce area. In FIG. 12A, a top view of the n+ active region 1200 and p+ active region 1201 is shown, and poly gate layer is added on the active regions in FIG. 12B, wherein poly gate 1212 and 1213 configure a latch including two cross coupled inverters, and poly gate 1211 and 1214 configure transfer gates for the cross coupled inverters. And the cross sectional view will be shown at a direction 1210 as below (in FIGS. 13 and 14), for clarifying vertical structure.

Figure 12B:
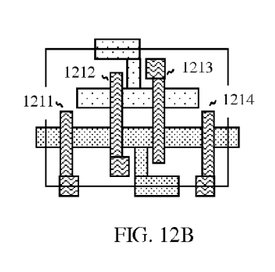
Figure 12C:
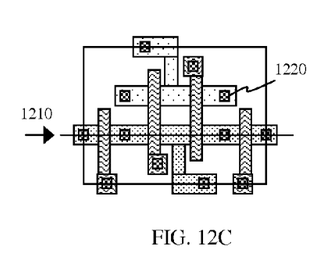
Figure 12D:
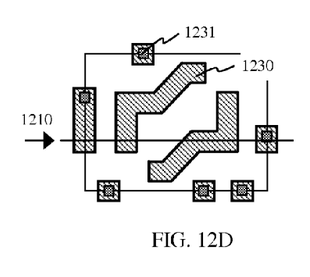
Figure 12E:
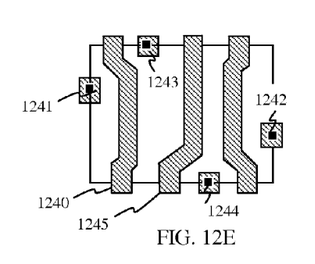
Figure 12F:
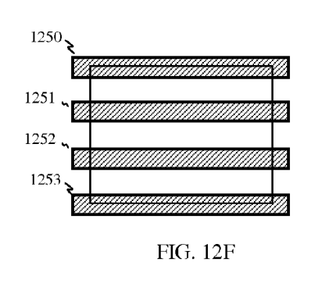

In FIG. 12C, contact region 1220 is defined in order to connect metal-1 layer 1230 which is shown in FIG. 12D. And via-1 region 1231 is added on the metal-1 region 1230 in FIG. 12D. And in FIG. 12E, metal-2 layer 1240 is defined, and via-2 region is added to connect bit line pair 1241 and 1242, the power supply node 1243 and ground node 1244, where a passing line 1245 is added for global word line. And in FIG. 12F, metal-3 layer is overlapped on the via-2 regions of FIG. 12E, in order to connected bit line pair 1251 and 1252, the power supply node 1250 and ground node 1253, respectively.

Figure 13:
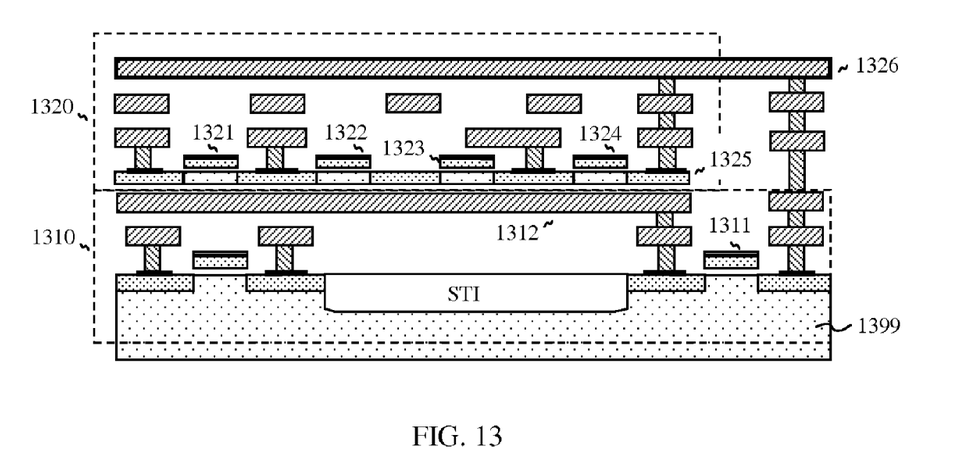
FIG. 13 illustrates a cross sectional view for the memory cell on the bulk of the wafer, according to the teachings of the present invention.

Referring now to FIG. 13 in view of FIGS. 12A to 12F, a cross sectional view for the example memory cell layout is illustrated. Poly gate 1322 and 1323 serve as gate of the latch including two poly gate (1212 and 1213 as shown in FIG. 12B), and the poly gate 1321 and 1324 serve as transfer transistors (1211 and 1214 as shown in FIG. 12B). Active region 1325 is formed from thin film polysilicon, such as LTPS (low temperature polysilicon). Metal bit line 1326 is connected to a transfer transistor 1311, which is connected to a segment read line (or segment bit line) 1312. The peripheral circuits including the transfer transistor 1311 are formed on the substrate 1399, where the transistors are isolated by shallow trench isolation (STI). And the cross sectional view is shown from the direction 1210 in FIG. 12D as an arrow.

Figure 14:
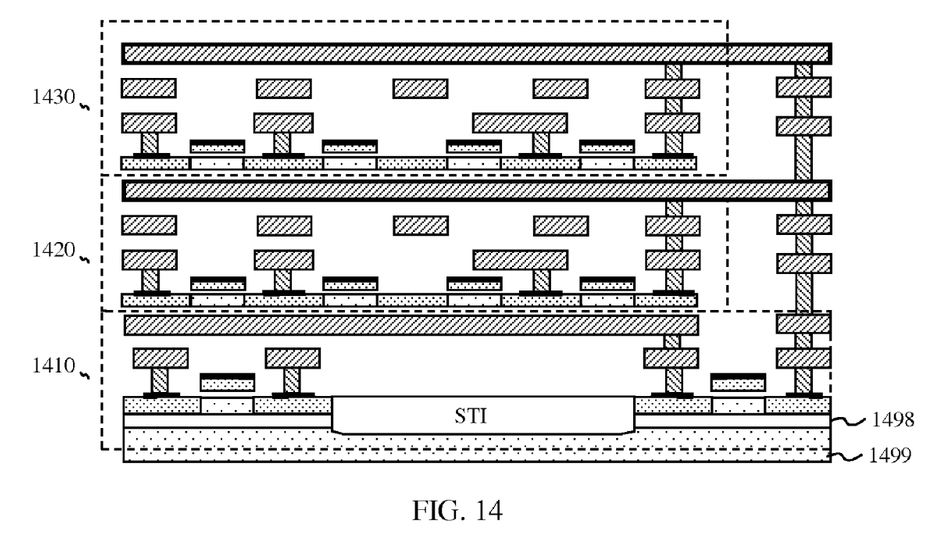
FIG. 14 illustrates a cross sectional view of the memory cell on the SOI (Silicon-on-Insulator) wafer, according to the teachings of the present invention.

In FIG. 14, alternative memory cell structure on the SOI (Silicon on Insulator) wafer is illustrated, wherein the peripheral circuit 1410 is formed on the buried oxide region 1498, and buried oxide region is formed on the substrate 1499. The memory cell 1420 is formed on the first floor, and the memory cell 1430 is formed on the third floor, in order to reduce chip area.

CONCLUSION

Stacked static random access memory is realized, wherein local bit lines are multi-divided to reduce parasitic loading, which achieves fast access with fast discharge time of the local bit line. Furthermore, the current flow of the cell transistor can be reduced because the cell transistor only drives a lightly loaded local bit line, which means that the cell transistor can be miniaturized further. And the segment read circuit configures an amplifier to amplify the local bit line voltage with active load portion of the block read circuit, and the amplifier output is transferred to another amplifier including a current mirror as a receiving transistor in the block read circuit. Furthermore, fast access time is achieved with no extra waiting time for reading the memory cell through the segment read circuit and the block read circuit. Additionally time-domain sensing scheme is introduced to differentiate high voltage data and low voltage data in the memory cell, because one of two data is arrived earlier. Thus, reference signal is generated by reference cells storing fast data such as high data, which is used to generate locking signal with tunable delay circuit to optimize delay time, so that the locking signal rejects latching low data to a latch circuit. Furthermore, various alternative configurations are described and an example application for content addressable memory is described. Furthermore, example memory cell layouts and cross sectional views are illustrated to minimize cell area. Still furthermore, the fabrication method is compatible with the conventional CMOS process with additional steps for forming thin film transistor.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
   a memory cell including an inverter pair and a pass transistor pair, wherein the inverter pair and the pass transistor pair configure a stacked-type memory cell structure having thin film poly crystalline silicon transistor which comprises an upper gate on a thin film layer, and which structure is stacked over a peripheral circuit; and the pass transistor pair is controlled by a word line pair;
   a memory segment wherein a bit line pair is connected to a memory cell array including a plurality of memory cell, a segment write circuit including a write transfer transistor pair, and a segment pre-charge circuit including a pre-charge transistor pair, and one of bit lines is connected to a segment read circuit; and
   the segment read circuit including a read transistor and a select transistor, wherein the read transistor receives one of bit line voltage and the read transistor is connected to the select transistor serially, where the read transistor serves as amplifying portion of an amplifier and the select transistor is connected to a block read line;
   a memory block including at least a memory segment and at least a block read circuit; and
   the block read circuit wherein a load device is connected to the block read line through a feedback transistor, such that the amplifier is composed of the load device and the read transistor of the segment read circuit; and a current mirror is connected to the load device to receive output of the amplifier and the output of the current mirror is stored to a cross coupled inverter latch; and first pre-charge transistor is connected to the block read line, second pre-charge transistor is connected to the load device, and third pre-charge transistor is connected to the current mirror; and the feedback transistor is controlled by the output of the cross coupled inverter latch; and
   the output of the cross coupled inverter latch is connected to gate of an output transfer transistor which is connected to output of a tri-state inverter and input of a read inverter; and the read inverter generates a read output;
   a read path including multiple buffers to transfer the read output of the block read circuit;
   a latch circuit storing the read output through the read path;
   a latch control circuit generating a locking signal to lock the latch circuit.

2. The memory device of claim 1, wherein the segment read circuit is composed of MOS transistor, such as NMOS field effect transistor, PMOS field effect transistor, low threshold NMOS field effect transistor and low threshold PMOS field effect transistor; and the load device and the current mirror of the block read circuit are composed of MOS transistor, such as NMOS field effect transistor, PMOS field effect transistor, low threshold NMOS field effect transistor and low threshold PMOS field effect transistor.

3. The memory device of claim 1, wherein the segment read circuit includes the read transistor, wherein gate of the read transistor is connected to one of bit lines, drain of the read transistor is connected to the block read line, and which transistor serves as amplifying portion of the amplifier.

4. The memory device of claim 1, wherein the segment read circuit includes the read transistor, the select transistor, a pre-charge transistor and a transfer transistor; and more specifically, the read transistor is connected to the select transistor serially, source of the read transistor is connected to power or ground node, gate of the read transistor is connected to one of bit lines through the transfer transistor, source of the select transistor is connected to drain of the read transistor, the pre-charge transistor is connected to gate of the read transistor, and drain of the select transistor configures an output portion; and the read transistor serves as receiving portion of the amplifier.

5. The memory device of claim 1, wherein the block read circuit includes multiple load devices which are tunable with select transistors; and more specifically, the load devices are connected to multiple segment read circuits through the block read line and a feedback transistor in order to configure the amplifier, a current mirror circuit is connected to the load devices to receive output of the amplifier in order to store the output of the amplifier to the cross coupled inverter latch; and the first pre-charge transistor is connected to the block read line, the second pre-charge transistor is connected to the active loads, the third pre-charge transistor is connected to the current mirror; and the feedback transistor is controlled by the output of the cross coupled latch; and the output of the cross coupled inverter latch is connected to an output transfer transistor which is connected to output of a tri-state inverter and input of a read inverter; and the read inverter generates read output.

6. The memory device of claim 1, wherein the block read circuit includes load devices; more specifically, load devices are connected to multiple segment read circuits through the block read line, so that the amplifier is composed of the load devices and the segment read circuit as amplifying device; and the block read line serving as output of the amplifier is connected to output of a tri-state inverter and input of a read inverter; and the read inverter generates read output.

7. The memory device of claim 1, wherein the block read circuit includes tunable load devices; more specifically, load devices are connected to multiple segment read circuits through the block read line, so that the amplifier is composed of the load devices and the segment read circuit as amplifying device; and the block read line serving as output of the amplifier is connected to output of a tri-state inverter and input of a read inverter; and the read inverter generates read output; and load device can be adjusted by select transistors.

8. The memory device of claim 1, wherein the block read circuit includes a tunable current mirror which is adjusted by select transistors; more specifically, active loads are connected to multiple segment read circuits through the block read line and a feedback transistor in order to configure the amplifier; and a tunable current mirror circuit is connected to active loads to receive output of the amplifier in order to store the output of the amplifier to the cross coupled inverter latch; and the first pre-charge transistor is connected to the block read line, the second pre-charge transistor is connected to the active loads, the third pre-charge transistor is connected to the current mirror; and the feedback transistor is controlled by the output of the cross coupled inverter latch; and the output of the cross coupled inverter latch serves as output of the block read circuit.

9. The memory device of claim 1, wherein the block read circuit includes a tunable current mirror which is adjusted by select transistors; more specifically, active loads are connected to multiple segment read circuits through the block read line and a feedback transistor in order to configure the amplifier; and a tunable current mirror circuit is connected to active loads to receive output of the amplifier in order to store the output of the amplifier to the cross coupled inverter latch; and the first pre-charge transistor is connected to the block read line, the second pre-charge transistor is connected to the active loads, the third pre-charge transistor is connected to the current mirror; and the feedback transistor is controlled by the output of the cross coupled inverter latch; and the output of the cross coupled inverter latch is connected to an output transfer transistor which is connected to output of a tri-state inverter and input of a read inverter; and the read inverter generates a read output.

10. The memory device of claim 1, wherein the block read circuit includes a differential amplifier; more specifically, a pair of receiving transistor of the differential amplifier is connected to a pair of block read line where one block read line is connected to a segment read circuit receiving voltage data from a selected memory cell, and another block read line is connected to another segment read circuit for generating reference voltage; and a load device is connected to each block read line, so that two identical amplifiers are composed of load devices and segment read circuits; and the output of the differential amplifier is connected to an output transfer transistor through a buffer circuit, which transistor is connected to another load device, output of a tri-state inverter and input of a read inverter; and the read inverter generates a read output.

11. The memory device of claim 1, wherein the block read circuit includes a differential amplifier; more specifically, a pair of receiving transistor of the differential amplifier is connected to a pair of block read line where one block read line is connected to a segment read circuit receiving voltage data from a selected memory cell, and another block read line is connected to another segment read circuit for generating reference voltage; and a load device is connected to each block read line, so that two identical amplifiers are composed of load devices and segment read circuits; and the output of the differential amplifier is connected to an output transfer transistor through a buffer circuit, which transistor is connected to another load device, output of a tri-state inverter and input of a read inverter; and the read inverter generates read output; and the strength of load devices are tunable with multiple transistors.

12. The memory device of claim 1, wherein the read inverter of the block read circuit includes a Schmidt trigger.

13. The memory device of claim 1, wherein the read path includes an inverting returning path.

14. The memory device of claim 1, wherein the latch control circuit receives a read enable signal from a control circuit and generates the locking signal to lock the latch circuit.

15. The memory device of claim 1, wherein the latch control circuit includes a tunable delay circuit; and more specifically, the delay circuit receives output of an OR gate receiving reference signals, which signals are generated by multiple memory blocks including reference memory cells, and the delay circuit delays the reference signal to generate the locking signal.

16. The memory device of claim 1, wherein the memory cell including the two inverters and the two pass transistors, wherein the word line controls pass transistors, and the word line has two states where one of the states is higher than a supply voltage of the memory block.

17. The memory device of claim 1, wherein the memory cell includes the two inverters and the two pass transistors, where one of the pass transistor is controlled by one word line during read operation, while the other pass transistor is turned off by another word line.

18. The memory device of claim 1, additionally comprising at least one compare circuit to configure a content addressable memory; and the compare circuit includes the first transistor set and the second transistor set, wherein the first signal set couples to control a conduction state of the first transistor set and the second signal set couples to control a conduction state of the second transistor set, wherein the first signal set includes stored data in the memory cell and the second signal set includes comparand data from an input device; and at least one compare circuit coupled among the memory cells and at least one match line to receive first and second signal sets and affect a logical state of the match line in response to a predetermined logical relationship between the first and second signal sets.

19. The memory device of claim 1, wherein the memory cell is stacked over another memory cell.

* * * * *